United States Patent
Han et al.

(10) Patent No.: US 9,922,832 B1
(45) Date of Patent: Mar. 20, 2018

(54) MANUFACTURING METHOD OF SEMICONDUCTOR STRUCTURE

(71) Applicant: UNITED MICROELECTRONICS CORP., Hsinchu (TW)

(72) Inventors: Xiao-Fei Han, Singapore (SG); Ju-Bao Zhang, Singapore (SG); Chao Jiang, Singapore (SG); Hong Liao, Singapore (SG); Wen-Wen Gong, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/628,753

(22) Filed: Jun. 21, 2017

(51) Int. Cl.
*H01L 21/28* (2006.01)
*H01L 29/66* (2006.01)

(52) U.S. Cl.
CPC .. *H01L 21/28273* (2013.01); *H01L 29/66825* (2013.01)

(58) Field of Classification Search
CPC .............. H01L 21/28273; H01L 29/66825
See application file for complete search history.

(56) References Cited

U.S. PATENT DOCUMENTS

| | | | |
|---|---|---|---|
| 6,546,306 B1* | 4/2003 | Bushman | B24B 37/042 438/624 |
| 6,700,143 B2 | 3/2004 | Tuan et al. | |
| 6,853,028 B2 | 2/2005 | Kim et al. | |
| 8,053,845 B2 | 11/2011 | Kwon et al. | |
| 2013/0075821 A1* | 3/2013 | Baars | H01L 29/66545 257/368 |

\* cited by examiner

*Primary Examiner* — Karen Kusumakar
(74) *Attorney, Agent, or Firm* — WPAT, PC

(57) ABSTRACT

A manufacturing method of a semiconductor structure is provided. The manufacturing method of the semiconductor structure includes the following steps: providing a semiconductor substrate, wherein the semiconductor substrate has a first region and a second region surrounding the first region; forming a gate stack and a dummy gate stack in the first region, wherein the dummy gate stack surrounds the gate stack; forming an oxide layer on an exterior wall and a top surface of the dummy gate stack; forming a dummy conductive layer on the gate stack, the dummy gate stack and the oxide layer, wherein the dummy conductive layer has a concave bowl-shaped top surface in the first region; and performing a chemical mechanical polishing (CMP) process on the dummy conductive layer.

17 Claims, 5 Drawing Sheets

MANUFACTURING METHOD OF SEMICONDUCTOR STRUCTURE

BACKGROUND

Technical Field

The present disclosure relates in general to a manufacturing method of a semiconductor structure, and more particularly to a manufacturing method of a semiconductor structure including a chemical mechanical polishing (CMP) process.

Description of the Related Art

Non-volatile memory devices have been widely developed and used in the past decades. In the process of forming flash memory cells, a chemical mechanical polishing (CMP) process is usually required for removing undesired layers. In order to prevent any damages that may be caused by the CMP process to the flash memory cells, researches and developments in manufacturing of such devices have been disclosed.

SUMMARY OF THE INVENTION

The present disclosure is directed to a manufacturing method of a semiconductor structure. In the embodiments of the present disclosure, In the embodiments, an oxide layer formed on the exterior wall and the top surface of the dummy gate stack generating the concave bowl-shaped top surface of the dummy conductive layer in the first region can provide effective compensation for the uninformed removal amounts in different areas by the CMP process, and thus the gate stack in the first region can be excellently protected from any damages by the CMP process.

According to an embodiment of the present disclosure, a manufacturing method of a semiconductor structure is disclosed. The manufacturing method of the semiconductor structure includes the following steps: providing a semiconductor substrate, wherein the semiconductor substrate has a first region and a second region surrounding the first region; forming a gate stack and a dummy gate stack in the first region, wherein the dummy gate stack surrounds the gate stack; forming an oxide layer on an exterior wall and a top surface of the dummy gate stack; forming a dummy conductive layer on the gate stack, the dummy gate stack and the oxide layer, wherein the dummy conductive layer has a concave bowl-shaped top surface in the first region; and performing a chemical mechanical polishing (CMP) process on the dummy conductive layer.

The disclosure will become apparent from the following detailed description of the preferred but non-limiting embodiments. The following description is made with reference to the accompanying drawings.

DETAILED DESCRIPTION OF THE INVENTION

Figure 1A:
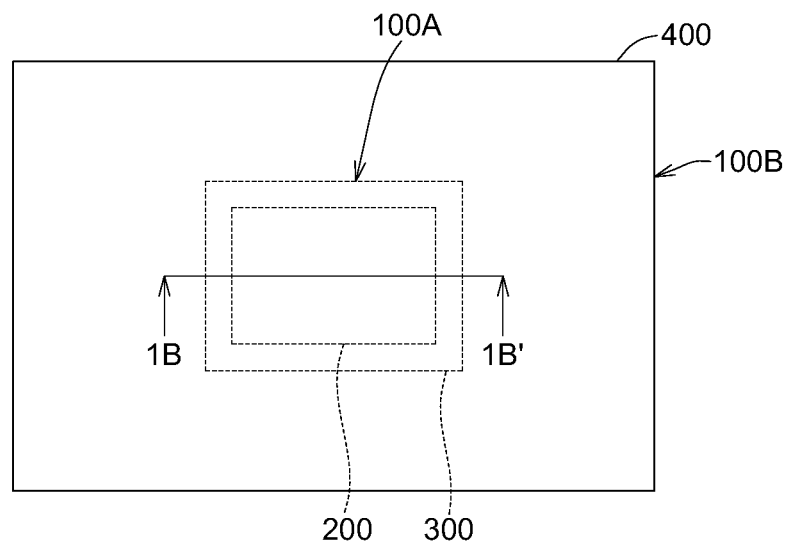
FIG. 1A to FIG. 5 illustrate a manufacturing method of a semiconductor structure according to an embodiment of the present disclosure.

According to the embodiments of the present disclosure, a manufacturing method of a semiconductor structure is provided. In the embodiments, an oxide layer formed on the exterior wall and the top surface of the dummy gate stack generating the concave bowl-shaped top surface of the dummy conductive layer in the first region can provide effective compensation for the uninformed removal amounts in different areas by the CMP process, and thus the gate stack in the first region can be excellently protected from any damages by the CMP process.

The embodiments are described in details with reference to the accompanying drawings. The procedures and details of the structures of the embodiments are for exemplification only, not for limiting the scope of protection of the disclosure. Moreover, the identical or similar elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regarded as an illustrative sense rather than a restrictive sense. It is to be noted that the drawings are simplified for clearly describing the embodiments, and the details of the structures of the embodiments are for exemplification only, not for limiting the scope of protection of the disclosure. Ones having ordinary skills in the art may modify or change the structures and/or the procedure steps according to the embodiments of the present disclosure.

FIG. 1A to FIG. 5 illustrate a manufacturing method of a semiconductor structure according to an embodiment of the present disclosure. Referring to FIGS. 1A-1B, FIG. 1A is a top view of the semiconductor structure in a processing step, and FIG. 1B is a cross-sectional view along the cross-sectional line 1B-1B' in FIG. 1A. It is to be noted that the drawings of the top views (e.g. FIG. 1A and FIG. 2A hereinafter) are simplified for clearly describing the embodiments.

Figure 1B:
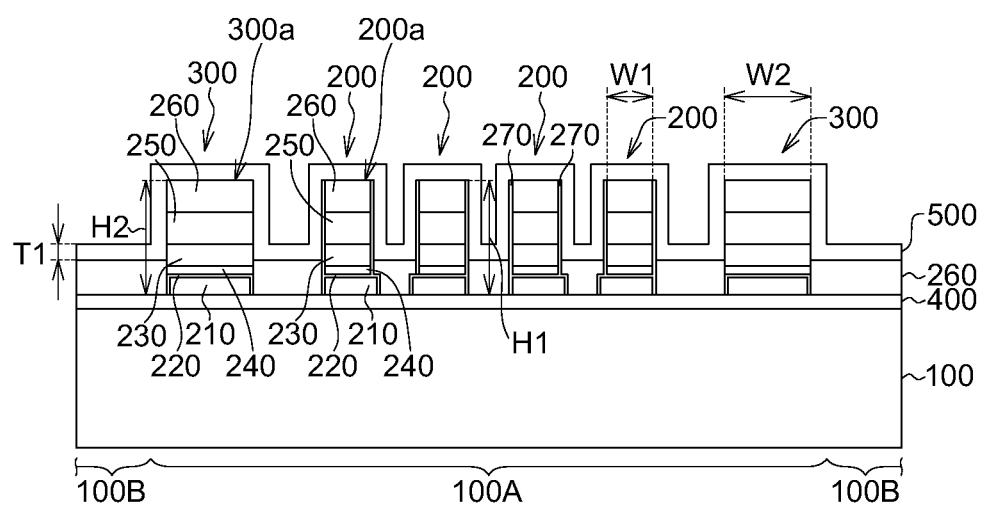

As shown in FIGS. 1A-1B, a semiconductor substrate 100 is provided, and the semiconductor substrate 100 has a first region 100A and a second region 100B surrounding the first region 100A. A gate stack 200 and a dummy gate stack 300 are formed in the first region 100A, and the dummy gate stack 300 surrounds the gate stack 200. In the embodiments, as shown in FIG. 1B, a plurality of gate stacks 200 may be formed in the first region 100A, and the dummy gate stack 300 surrounds the plurality of gate stacks 200. In some embodiments, the first region 100A is such as a cell region, and the second region 100B is such as a logic region.

In the embodiments, the gate stack 200 may be a flash cell structure, and the dummy gate stack 300 may be a dummy cell structure. The dummy gate stack 300 is not related to any cell operations.

In the embodiments, as shown in FIG. 1B, the process of forming the gate stack 200 may include forming a floating gate 210 in the first region 100A of the semiconductor substrate 100, forming a dielectric layer 220 (e.g. silicon oxide) on the floating gate 210, and forming a control gate 230 on the dielectric layer 220. As shown in FIG. 1B, in the embodiment, the process of forming the gate stack 200 may further include forming a nitride layer 240 (e.g. silicon nitride) between the dielectric layer 210 and the control gate 230, forming a hard mask layer 250 (e.g. silicon nitride) on the control gate 230, and forming a conductive layer 260 (e.g. polysilicon or conductive metal) on the hard mask layer 250.

The manufacturing process of forming the gate stack 200 including the floating gate 210, the nitride layer 240, the dielectric layer 220, the control gate 230, the hard mask layer 250 and the conductive layer 260 may be performed in various ways. For example, a layer of conductive material (e.g. polysilicon or conductive metal), a layer of dielectric material, a layer of silicon nitride, another layer of conductive material and another layer of silicon nitride are formed in sequence on the semiconductor substrate 100. Next, the upper layer of silicon nitride is patterned for forming the hard mask layers 250, and then the stacked layers below the hard mask layers 250 are patterned according to the pattern of the hard mask layers 250 for forming the floating gates 210, the nitride layers 240, the dielectric layers 220 and the control gates 230. Then, a layer of conductive material is formed on top of the hard mask layers 250 as well as on the semiconductor substrate 100 for forming the conductive layer 260. As such, as shown in FIG. 1B, the gate stacks 200 and the dummy gate stack 300 are formed, and the as-formed dummy gate stack 300 includes, likewise, the floating gate 210, the nitride layer 240, the dielectric layer 220, the control gate 230, the hard mask layer 250 and the conductive layer 260.

In the embodiments, as shown in FIG. 1B, an insulation layer 400, e.g. a silicon oxide layer, may be formed on the semiconductor substrate 100 and located between the floating gate 210 and the semiconductor substrate 100. In the embodiments, as shown in FIG. 1B, before forming the conductive layer 260, spacers 270 may be formed on sidewalls of the gate stacks 200.

In addition, as shown in FIG. 1B, in the embodiments, some portions of the conductive layer 260 formed on the hard mask layers 250 together with the floating gates 210, the nitride layers 240, the dielectric layers 220 and the control gates 230 form the gate stacks 200 and the dummy gate stack 300; some other portions of the conductive layer 260 are formed in the first region 100A between the gate stacks 200 as well as in the second region 100B, and those formed in the second region 100B may be used as logic gates.

As shown in FIG. 1B, since the gate stack 200 and the dummy gate stack 300 are formed from the same material layers and by the same manufacturing process, in the embodiment, a height H1 of the gate stack 200 and a height H2 of the dummy gate stack 300 are substantially the same. Likewise, since the gate stack 200 and the dummy gate stack 300 are formed from the same material layers and by the same manufacturing process, in the embodiment, a top surface 200a of the gate stack 200 and the a surface 300a of the dummy gate stack 300 are substantially coplanar. The term "substantially the same" and the term ""substantially coplanar" used herein are defined as "approximately the same" and "approximately coplanar", respectively, and indicate that minor differences or unevenness caused unintentionally by manufacturing steps and within processing tolerance are encompassed within the scopes of "substantially the same" and the term ""substantially coplanar".

In some embodiments, the height H1 of the gate stack 200 and the height H2 of the dummy gate stack 300 are such as 3000-4000 Å.

As shown in FIG. 1B, in the embodiment, the width W1 of the gate stack 200 is smaller than the width W2 of the dummy gate stack 300. For example, a ratio (W1/W2) of the width W1 of the gate stack 200 to the width W2 of the dummy gate stack 300 is less than 1 and larger than 0.1. In some embodiments, the ratio (W1/W2) of the width W1 of the gate stack 200 to the width W2 of the dummy gate stack 300 is about 0.2.

Next, as shown in FIGS. 1A-1B, an oxide material 500 is formed for covering the dummy gate stack 300 and the gate stack 200. In the embodiments, as shown in FIGS. 1A-1B, the oxide material 500 also covers the second region 100B of the semiconductor substrate 100.

In the embodiments, the thickness T1 of the oxide material 500 is equal to or larger than 1000 Å. In some embodiments, the thickness T1 of the oxide material 500 may be 1000 Å.

Figure 2A:
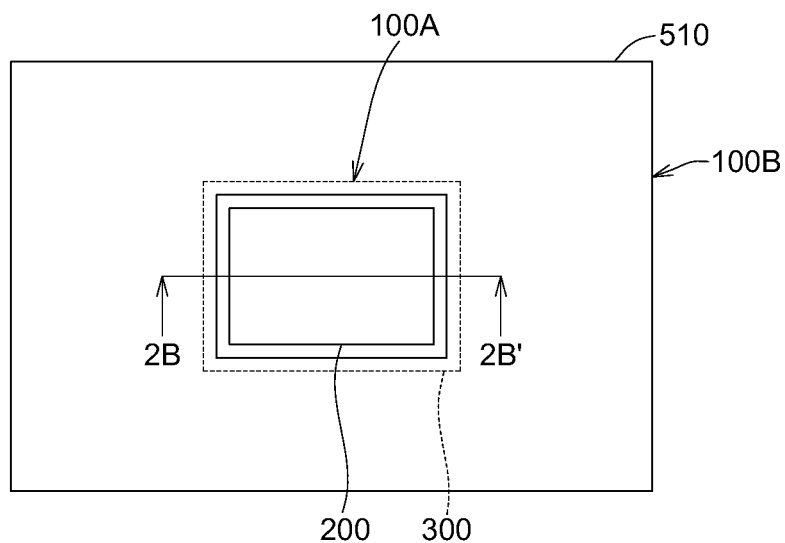
Figure 2B:
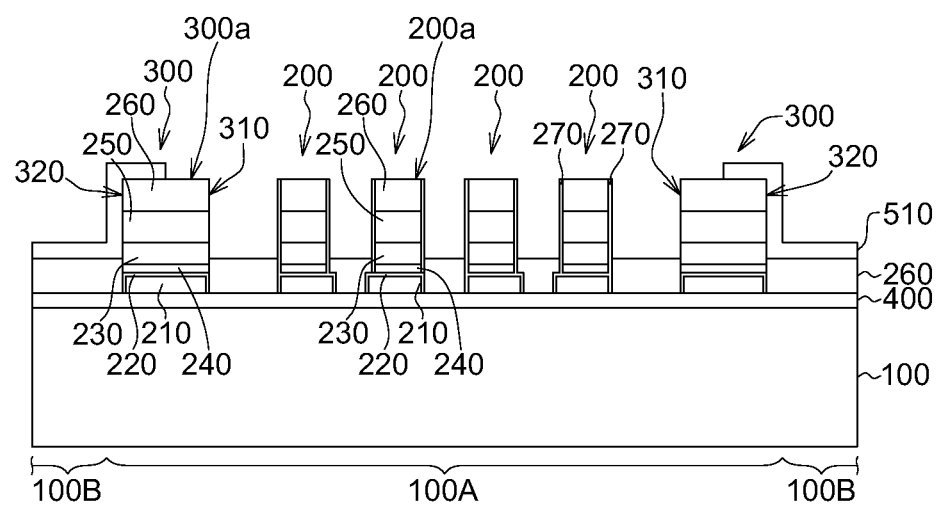

Next, referring to FIGS. 2A-2B, FIG. 2A is a top view of the semiconductor structure in a processing step subsequent to the step as shown in FIGS. 1A-1B, and FIG. 2B is a cross-sectional view along the cross-sectional line 2B-2B' in FIG. 2A. It is to be noted that the drawings of the top view as shown in FIG. 2A is simplified for clearly describing the embodiments.

As shown in FIGS. 2A-2B, a portion of the oxide material 500 is removed for exposing an interior wall 310 of the dummy gate stack 300 and the top surface 200a of the gate stack 200. As such, an oxide layer 510 is formed on an exterior wall 320 and the top surface 300a of the dummy gate stack 300. The oxide layer 510 has the same thickness T1 as that of the oxide material 500, and the thickness T1 of the oxide layer 510 may be 1000-1500 Å.

In the embodiments, the oxide layer 510 covers the second region 100B of the semiconductor substrate 100 and extends toward the first region 100A to cover the exterior wall 320 of the dummy gate stack 300. As shown in FIG. 2B, the oxide layer 510 covers the junction where the first region 100A is connected to the second region 100B, such that the junction is not damaged or affected by following manufacturing processes, such as etching processes and etc.

In some embodiments, a ratio of the thickness T1 of the oxide layer 510 to the height H1 of the gate stack 200 is such as 0.2-0.25.

In some embodiments, as shown in FIG. 2B, a portion of the top surface 300a of the dummy gate stack 300 may be exposed from the oxide layer 510.

Figure 3:
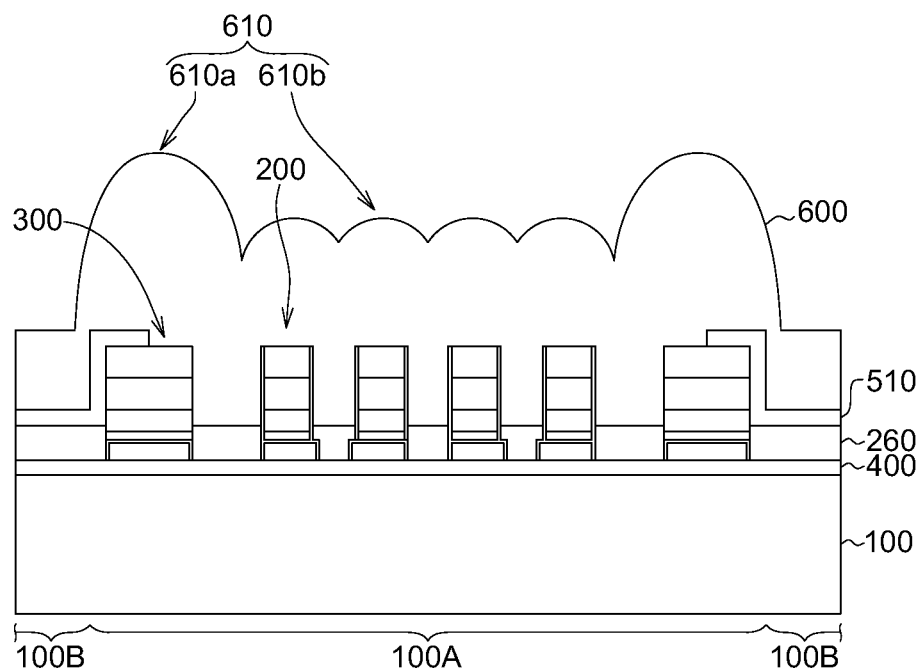

Next, referring to FIG. 3, a dummy conductive layer 600 is formed on the gate stack 200, the dummy gate stack 300 and the oxide layer 510, and the dummy conductive layer 600 has a concave bowl-shaped top surface 610 in the first region 100A.

As shown in FIG. 3, a bottom 610b of the concave bowl-shaped top surface 610 is located above the gate stack 200, and an upper edge 610a of the concave bowl-shaped top surface 610 is located above the oxide layer 510 and the dummy gate stack 300. In other words, the major central portion of the first region 100A where the gate stacks 200 are located is below the bottom 610b of the concave bowl-shaped top surface 610 of the dummy conductive layer 600, and the peripheral portion of the first region 100A where the dummy gate stack 300 is located is below the upper edge 610a of the concave bowl-shaped top surface 610 of the dummy conductive layer 600. As shown in FIG. 3, the oxide layer 510 and the dummy conductive layer 600 at the upper edge 610a provide a relatively high wall at the peripheral portion of the first region 100A.

In the embodiment, the upper edge 610a of the concave bowl-shaped top surface 610 is higher than the bottom 610b of the concave bowl-shaped top surface 610 by 1000-1500 Å.

Figure 4:
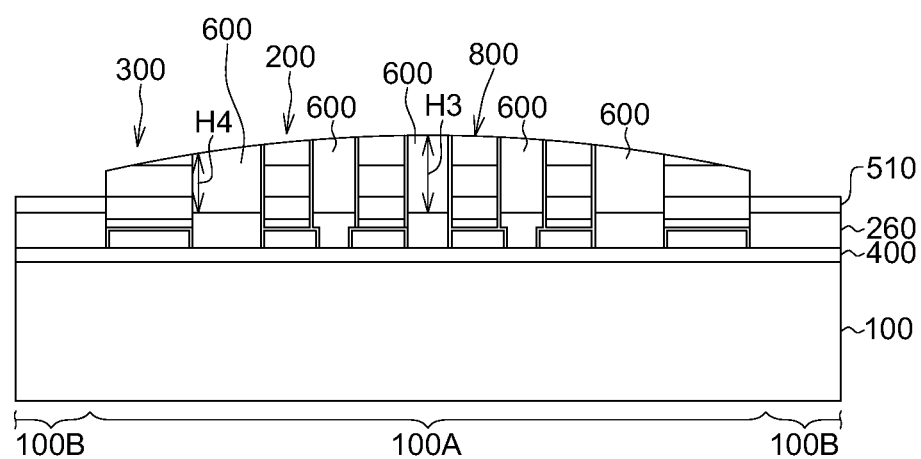

Next, referring to FIG. 4, a chemical mechanical polishing (CMP) process is performed on the dummy conductive layer 600. In the embodiments, a polishing velocity of the CMP process is such as 2000 Å/min, and a polishing pressure of the CMP process is such as 2 Psi.

As shown in FIG. 4, the dummy conductive layer 600 is partially removed by performing the CMP process for planarizing the concave bowl-shaped top surface 610 of the dummy conductive layer 600 in the first region 100A, and a difference between heights of the dummy conductive layer 600 in different areas in the first region 100A is less than 100 Å. In the embodiment, as shown in FIG. 4, the oxide layer 510 in the first region 100A is also removed by performing the CMP process.

In the embodiments, as shown in FIG. 4, after the dummy conductive layer 600 is partially removed by performing the CMP process, the remained dummy conductive layer 600 is located between the gate stacks 200 and between the gate stack 200 and the dummy gate stack 300, and the remained dummy conductive layer 600 together with the gate stacks 200 and the dummy gate stacks 300 form a structure with a planarized top surface 800. For example, the remained dummy conductive layer 600 located between the gate stacks 200 has a height H3, the remained dummy conductive layer 600 located between the gate stack 200 and the dummy conductive layer 300 has a height H4, and the difference between the height H3 and the height H4 is less than 100 Å.

According to the embodiments of the present disclosure, the oxide layer 510 and the dummy conductive layer 600 at the upper edge 610a provide a relatively high wall at the peripheral portion of the first region 100A, and such higher structure at the peripheral portion of the first region 100A can compensate the higher removal amount at the peripheral portion by the CMP process; thus the large differences between heights/thickness of polished convex dish-like surfaces in the central area and in the peripheral area usually caused by CMP processes can be prevented. In the embodiments, the small difference, i.e. less than 100 Å, between heights of the dummy conductive layer 600 in different areas in the first region 100A shows that a relatively planar top surface 800 is formed after the CMP process, indicating that the oxide layer 510 formed on the exterior wall 320 and the top surface 300a of the dummy gate stack 300 generating the concave bowl-shaped top surface 610 of the dummy conductive layer 600 in the first region 100A can provide effective compensation for the uninformed removal amounts in different areas by the CMP process, and thus the gate stacks 200 in the first region 100A can be excellently protected from any damages by the CMP process.

Moreover, while the polishing velocity and/or the polishing pressure of a CMP process is increased, the polished convex dish-like surface is formed more easily; in contrast, according to the embodiments of the present disclosure, due to the compensation effects for the uninformed removal amounts in different areas by the CMP process provided by the concave bowl-shaped top surface 610 of the dummy conductive layer 600, the polishing velocity and the polishing pressure of the CMP process can be increased to a certain level, such that the overall processing time can be reduced, and a relatively planar top surface 800 can be formed after the CMP process as well.

Furthermore, while conventionally a dummy gate is required to have a width that is at least ten times the width of a gate in the cell region in order to provide enough sacrificing amount removed by a CMP process and to prevent the gate to be damaged by the CMP process; in contrast, according to the embodiments of the present disclosure, as aforementioned, the concave bowl-shaped top surface 610 of the dummy conductive layer 600 in the first region 100A can provide effective compensation for the uninformed removal amounts in different areas by the CMP process, such that the width W2 of the dummy gate stack 300 can be reduced to be less than ten times the width W1 of the gate stack 200, and thus the overall area occupied by the dummy gate stack 300 and the gate stacks 200 can be reduced, achieving the effects of a reduced size of the semiconductor structure.

Figure 5:
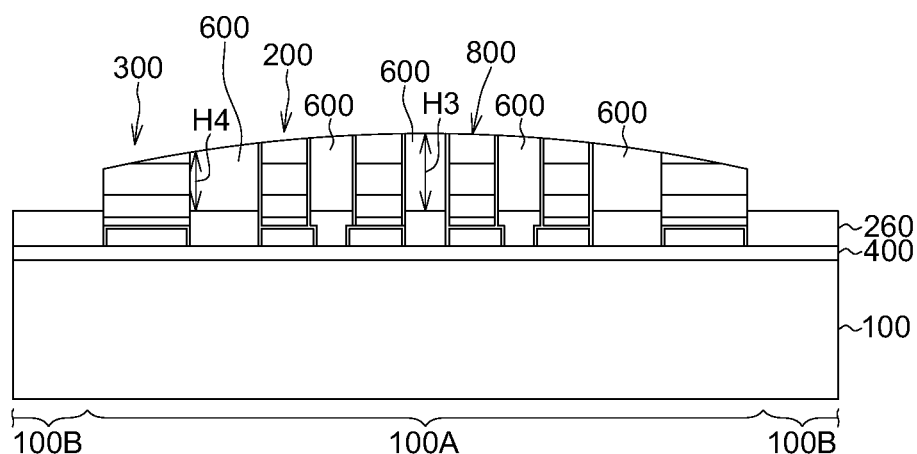

Next, referring to FIG. 5, the oxide layer 510 in the second region 100B is removed after performing the CMP process. As such, the semiconductor structure of the embodiments is formed.

Figure 6:
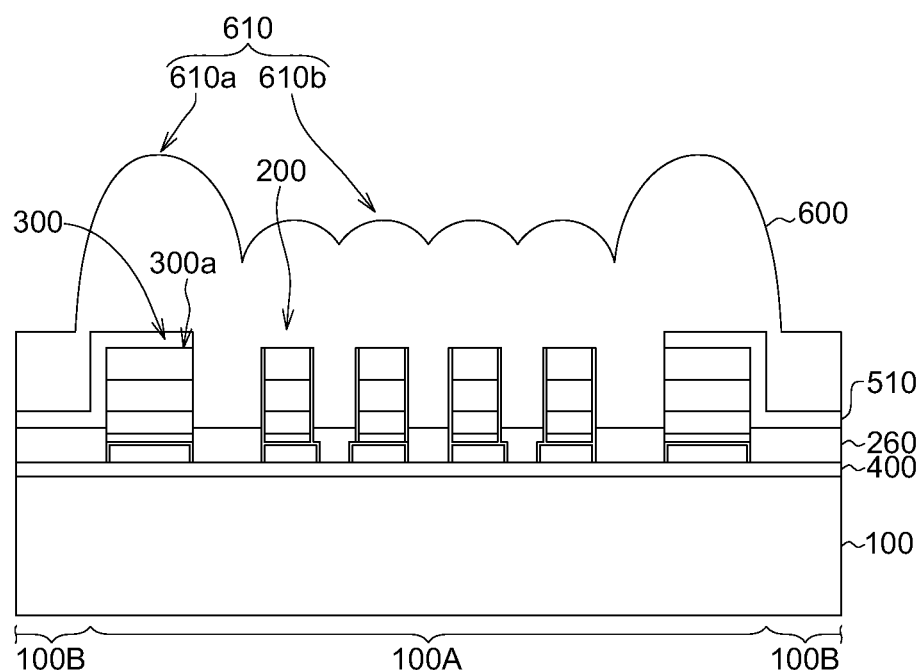
FIG. 6 illustrates a manufacturing method of a semiconductor structure according to another embodiment of the present disclosure.

FIG. 6 illustrates a manufacturing method of a semiconductor structure according to another embodiment of the present disclosure. The elements in the present embodiment sharing similar or the same labels with those in the previous embodiment are similar or the same elements, and the description of which is omitted.

Referring to FIG. 1A to FIG. 5 and FIG. 6, the present embodiment is different from the previous embodiment in that after the gate stack 200 and the dummy gate stack 300 are formed in the first region 100A of the semiconductor structure 100, as shown in FIGS. 1A-1B, the oxide layer 510 is formed on the exterior wall 320 and the top surface 300a of the dummy gate stack 300, as shown in FIG. 6, and the oxide layer 510 substantially covers the top surface 300a of the dummy gate stack 300a.

Next, as show in FIG. 6 and FIGS. 3-5, similar to the previous embodiment, the dummy conductive layer 600 is formed on the gate stack 200, the dummy gate stack 300 and the oxide layer 510, and then a CMP process is performed on the dummy conductive layer 600.

Figure 7:
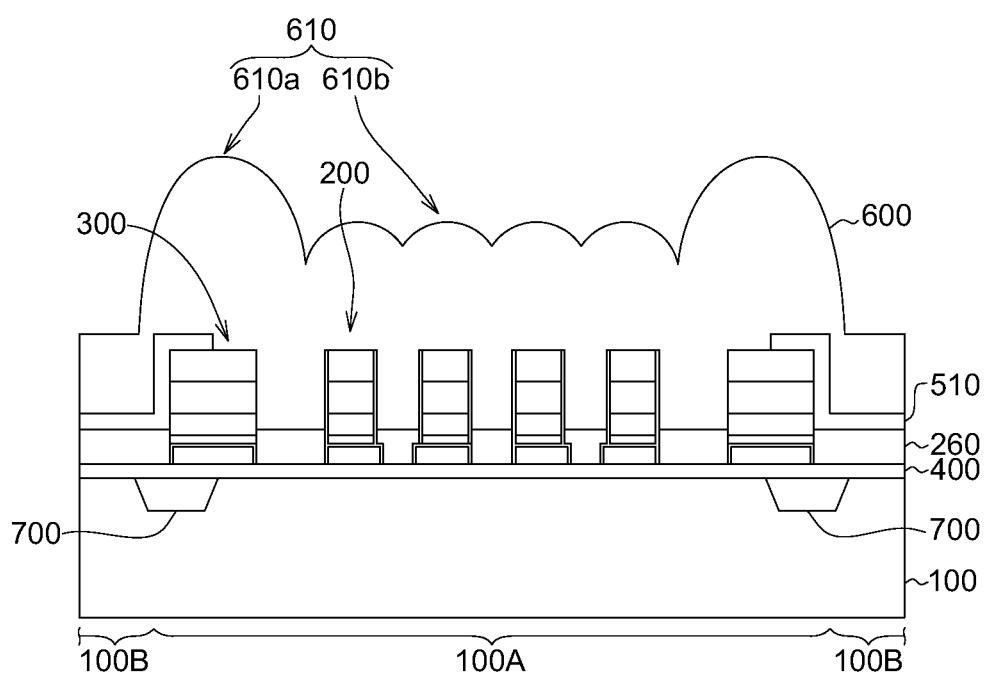
FIG. 7 illustrates a manufacturing method of a semiconductor structure according to a further embodiment of the present disclosure.

FIG. 7 illustrates a manufacturing method of a semiconductor structure according to a further embodiment of the present disclosure. The elements in the present embodiment sharing similar or the same labels with those in the previous embodiment are similar or the same elements, and the description of which is omitted.

Referring to FIG. 1A to FIG. 5 and FIG. 7, the present embodiment is different from the previous embodiment in that before the gate stack 200 and the dummy gate stack 300 are formed in the first region 100A of the semiconductor structure 100, as shown in FIGS. 1A-1B, an isolation structure 700, e.g. a shallow trench isolation (STI), is formed in the semiconductor substrate 100 and located between the first region 100A and the second region 100B, as shown in FIG. 7.

Next, as show in FIG. 7 and FIG. 2A to FIG. 5, similar to the previous embodiment, the oxide layer 510 is formed on the exterior wall 320 and the top surface 300a of the dummy gate stack 300, the dummy conductive layer 600 is formed on the gate stack 200, the dummy gate stack 300 and the oxide layer 510, and then a CMP process is performed on the dummy conductive layer 600.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor structure, comprising:

providing a semiconductor substrate, wherein the semiconductor substrate has a first region and a second region surrounding the first region;

forming a gate stack and a dummy gate stack in the first region, wherein the dummy gate stack surrounds the gate stack;

forming an oxide layer on an exterior wall and a top surface of the dummy gate stack;

forming a dummy conductive layer on the gate stack, the dummy gate stack and the oxide layer, wherein the dummy conductive layer has a concave bowl-shaped top surface in the first region; and performing a chemical mechanical polishing (CMP) process on the dummy conductive layer.

2. The manufacturing method of the semiconductor structure according to claim 1, wherein a bottom of the concave bowl-shaped top surface is located above the gate stack, and an upper edge of the concave bowl-shaped top surface is located above the oxide layer and the dummy gate stack.

3. The manufacturing method of the semiconductor structure according to claim 2, wherein the upper edge of the concave bowl-shaped top surface is higher than the bottom of the concave bowl-shaped top surface by 1000-1500 Å.

4. The manufacturing method of the semiconductor structure according to claim 1, wherein forming the oxide layer on the exterior wall and the top surface of the dummy gate stack comprises:

forming an oxide material covering the dummy gate stack and the gate stack; and removing a portion of the oxide material for exposing an interior wall of the dummy gate stack and a top surface of the gate stack.

5. The manufacturing method of the semiconductor structure according to claim 1, wherein a thickness of the oxide layer is 1000-1500 Å.

6. The manufacturing method of the semiconductor structure according to claim 1, wherein a ratio of a thickness of the oxide layer to a height of the gate stack is 0.2-0.25.

7. The manufacturing method of the semiconductor structure according to claim 1, wherein the oxide layer is further formed in the second region of the semiconductor substrate, and the manufacturing method of the semiconductor structure further comprises:

removing the oxide layer in the second region after performing the CMP process.

8. The manufacturing method of the semiconductor structure according to claim 1, wherein a portion of the top surface of the dummy gate stack is exposed from the oxide layer.

9. The manufacturing method of the semiconductor structure according to claim 1, wherein the gate stack is a flash cell structure, and the dummy gate stack is a dummy cell structure.

10. The manufacturing method of the semiconductor structure according to claim 9, wherein forming the gate stack comprises:

forming a floating gate in the first region of the semiconductor substrate;

forming a dielectric layer on the floating gate; and forming a control gate on the dielectric layer.

11. The manufacturing method of the semiconductor structure according to claim 1, wherein a height of the gate stack and a height of the dummy gate stack are substantially the same.

12. The manufacturing method of the semiconductor structure according to claim 11, wherein a top surface of the gate stack and the top surface of the dummy gate stack are substantially coplanar.

13. The manufacturing method of the semiconductor structure according to claim 1, wherein a ratio of a width of the gate stack to a width of the dummy gate stack is less than 1 and larger than 0.1.

14. The manufacturing method of the semiconductor structure according to claim 1, wherein a polishing velocity of the CMP process is 2000 Å/min, and a polishing pressure of the CMP process is 2 Psi.

15. The manufacturing method of the semiconductor structure according to claim 1, wherein the oxide layer in the first region is removed by performing the CMP process.

16. The manufacturing method of the semiconductor structure according to claim 1, wherein the dummy conductive layer is partially removed by performing the CMP process for planarizing the concave bowl-shaped top surface of the dummy conductive layer in the first region, and a difference between heights of the dummy conductive layer in different areas in the first region is less than 100 Å.

17. The manufacturing method of the semiconductor structure according to claim 1, further comprising:

forming an isolation structure in the semiconductor substrate and located between the first region and the second region.

* * * * *